United States Patent
Kim et al.

(10) Patent No.: US 9,865,319 B2
(45) Date of Patent: Jan. 9, 2018

(54) ELECTRONIC DEVICE AND METHOD FOR FABRICATING THE SAME

(71) Applicant: SK hynix Inc., Icheon-Si (KR)

(72) Inventors: Yang-Kon Kim, Icheon-si (KR); Bo-Mi Lee, Icheon-Si (KR); Won-Joon Choi, Icheon-Si (KR); Guk-Cheon Kim, Icheon-Si (KR); Jong-Koo Lim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 12 days.

(21) Appl. No.: 14/846,812

(22) Filed: Sep. 6, 2015

(65) Prior Publication Data

US 2016/0180905 A1    Jun. 23, 2016

(30) Foreign Application Priority Data

Dec. 17, 2014  (KR) .................. 10-2014-0182542

(51) Int. Cl.
    *G11C 11/16*  (2006.01)
    *H01L 43/08*  (2006.01)
    *H01L 45/00*  (2006.01)

(52) U.S. Cl.
    CPC .......... *G11C 11/161* (2013.01); *H01L 43/08* (2013.01); *H01L 45/1253* (2013.01)

(58) Field of Classification Search
    CPC .................... G11C 11/16; H01L 45/1253
    USPC ........................................ 365/148
    See application file for complete search history.

(56) References Cited

U.S. PATENT DOCUMENTS

| | | | |
|---|---|---|---|
| 6,114,719 A | * | 9/2000 | Dill ................ G11C 11/16 257/295 |
| 7,046,489 B2 | | 5/2006 | Kamiguchi et al. |
| 8,084,835 B2 | | 12/2011 | Ranjan et al. |
| 9,130,155 B2 | | 9/2015 | Chepulskyy et al. |
| 2002/0146895 A1 | | 10/2002 | Ramdani et al. |
| 2006/0098354 A1 | | 5/2006 | Parkin |
| 2006/0261425 A1 | | 11/2006 | Suemitsu et al. |

(Continued)

FOREIGN PATENT DOCUMENTS

| KR | 1020030000137 A | 1/2003 |
|---|---|---|
| KR | 1020030054175 A | 7/2003 |

(Continued)

OTHER PUBLICATIONS

USPTO Final Office Action issued for U.S. Appl. No. 14/158,702, dated Dec. 23, 2015 (10 pages).

(Continued)

*Primary Examiner* — Jason Lappas
(74) *Attorney, Agent, or Firm* — Perkins Cole LLP

(57) ABSTRACT

Provided is an electronic device including a semiconductor memory. The semiconductor memory may include: an under layer including first and second metal layers and a barrier layer having a dual phase structure of different crystal structures and interposed between the first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers.

17 Claims, 9 Drawing Sheets

(56) References Cited

U.S. PATENT DOCUMENTS

| | | |
|---|---|---|
| 2007/0076471 A1 | 4/2007 | Kano et al. |
| 2007/0187785 A1 | 8/2007 | Hung et al. |
| 2007/0297220 A1 | 12/2007 | Yoshikawa et al. |
| 2010/0055501 A1 | 3/2010 | Nishimura et al. |
| 2010/0074092 A1 | 3/2010 | Zhu et al. |
| 2010/0080048 A1 | 4/2010 | Liu et al. |
| 2011/0089507 A1 | 4/2011 | Mao |
| 2011/0198756 A1 | 8/2011 | Thenappan et al. |
| 2011/0228223 A1* | 9/2011 | Jiao .................. A61B 3/102 351/206 |
| 2011/0248235 A1 | 10/2011 | Jeong et al. |
| 2011/0297646 A1 | 12/2011 | deVillers et al. |
| 2012/0092923 A1 | 4/2012 | Bedeschi et al. |
| 2012/0267733 A1 | 10/2012 | Hu et al. |
| 2012/0326252 A1 | 12/2012 | Yamakawa et al. |
| 2013/0005151 A1 | 1/2013 | Chen et al. |
| 2013/0043530 A1 | 2/2013 | Kim et al. |
| 2013/0052826 A1 | 2/2013 | Nepomnishy et al. |
| 2013/0119494 A1 | 5/2013 | Li et al. |
| 2013/0134534 A1 | 5/2013 | Sbiaa et al. |
| 2013/0161768 A1 | 6/2013 | Khvalkovskiy et al. |
| 2013/0248798 A1 | 9/2013 | Yi et al. |
| 2013/0258763 A1 | 10/2013 | Ranjan et al. |
| 2014/0099735 A1 | 4/2014 | Horng et al. |
| 2014/0242418 A1 | 8/2014 | Shukh |
| 2014/0247648 A1* | 9/2014 | Yoon .................. H01L 45/1253 365/148 |
| 2014/0327095 A1 | 11/2014 | Kim et al. |
| 2014/0365688 A1 | 12/2014 | Lee et al. |
| 2015/0092480 A1 | 4/2015 | Choi et al. |
| 2015/0162526 A1 | 6/2015 | Lee et al. |
| 2015/0249206 A1 | 9/2015 | Kim et al. |
| 2015/0357557 A1 | 12/2015 | Kim et al. |
| 2016/0157715 A1* | 6/2016 | De Boer ............... A61B 3/0025 351/206 |
| 2016/0181514 A1 | 6/2016 | Kim et al. |
| 2016/0308121 A1 | 10/2016 | Kim |
| 2017/0062712 A1 | 3/2017 | Choi et al. |
| 2017/0069837 A1 | 3/2017 | Choi et al. |

FOREIGN PATENT DOCUMENTS

| | | |
|---|---|---|
| KR | 1020040005472 A | 1/2004 |
| KR | 1020060000878 A | 1/2006 |
| KR | 100641500 B1 | 10/2006 |
| KR | 1020060118311 A | 11/2006 |
| KR | 1020070036704 A | 4/2007 |
| KR | 1020070054551 A | 5/2007 |
| KR | 1020090038809 A | 4/2009 |
| KR | 1020100005449 A | 1/2010 |
| KR | 1020100030054 A | 3/2010 |
| KR | 1020100128219 A | 12/2010 |
| KR | 101073132 B1 | 6/2011 |
| KR | 101055595 B1 | 8/2011 |
| KR | 1020120047356 A | 5/2012 |
| KR | 1020120058113 A | 6/2012 |
| KR | 1020120078631 A | 7/2012 |
| KR | 101171387 B1 | 8/2012 |
| KR | 101209328 B1 | 12/2012 |
| KR | 1020130069097 A | 6/2013 |
| KR | 10-2014-0011138 A | 1/2014 |
| KR | 10-2014-0025165 A | 3/2014 |

OTHER PUBLICATIONS

USPTO Non-Final Office Action issued for U.S. Appl. No. 14/158,702, dated Jul. 17, 2015 (16 pages).
USPTO Notice of Allowance and Fees Due for U.S. Appl. No. 14/229,745, dated Oct. 3, 2014 (12 pages).
USPTO Non-Final Office Action issued for U.S. Appl. No. 14/295,229, dated May 22, 2015 (14 pages).
USPTO Non-Final Office Action issued for U.S. Appl. No. 14/621,646, dated Sep. 15, 2016 (10 pages).
USPTO Non-Final Office Action issued for U.S. Appl. No. 14/295,229, dated Oct. 11, 2016 (23 pages).
Notice of Allowance for U.S. Appl. No. 14/918,356, dated Aug. 8, 2017 (14 pages).
Final Office Action for U.S. Appl. No. 14/295,229, dated May 4, 2017 (25 pages).
USPTO Non-Final Office Action for U.S. Appl. No. 14/295,229, dated Sep. 27, 2017 (24 pages).
USPTO Non-Final Office Action for U.S. Appl. No. 14/788,420, dated Sep. 12, 2017 (42 pages).

* cited by examiner

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0182542, entitled "ELECTRONIC DEVICE AND METHOD FOR FABRICATING THE SAME" and filed on Dec. 17, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the characteristic of a variable resistance element.

In an implementation, there is provided an electronic device including a semiconductor memory. The semiconductor memory may include: an under layer comprising first and second metal layers and a barrier layer having a dual phase structure of different crystal structures and interposed between the first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction.

In some implementations, the barrier layer includes a first material having an FCC (Face Centered Cubic) structure and a second material having a wurtzite structure. In some implementations, the barrier layer includes an alloy of the first and second materials. In some implementations, the first material comprises HfN, TiN, MoN, ZrN, or MgO. In some implementations, the second material comprises AlN, AgI, ZnO, CdS, CdSe, a-SiC, GaN, or BN. In some implementations, the first metal layer has an HCP (Hexagonal Closed Packed) structure or a crystal structure of NaCl. In some implementations, the second metal layer comprises a metal nitride layer including a light metal. In some implementations, the first metal layer is positioned under the second metal layer. In some implementations, the first metal layer includes Hf, Zr, Mg, Ru, or Os. In some implementations, the first metal layer includes ZrN, HfN, or TiN. In some implementations, the second metal layer comprises Al or Ti. In some implementations, the semiconductor memory further comprises a magnetism correction layer formed over the second magnetic layer and configured to produce a magnetic field at the first magnetic layer to reduce an influence of a magnetic field of the second magnetic layer at the first magnetic layer.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, an electronic device is provided to comprise a plurality of semiconductor memory unit cells, wherein each semiconductor memory unit cell comprises: an under layer including a barrier layer having different materials having different crystal structures; and a variable resistance element formed over the under layer and operable to be switched between different resistance states to store data, wherein the variable resistance element has a normalized perpendicular anisotropy field (Hk) value which remains almost constant with a change of temperature around the variable resistance element.

In some implementations, the barrier layer includes a first material having an FCC structure and a second material having a wurtzite structure. In some implementations, the electronic device further comprises a magnetism correction layer formed over the variable resistance element to offset the influence of a stray field generated by the variable resistance element on a performance of the variable resistance element.

In another implementation, a method of fabricating an electronic device including a semiconductor memory, comprising: forming an under layer over a substrate to include a first metal layer and a second metal layer formed over the first metal layer, and a barrier layer between the first and the second metal layers to have a dual phase structure that stabilizes the crystal orientation of the second metal layer; forming a first magnetic layer over the under layer to have a variable magnetization direction; forming a tunnel barrier layer over the first magnetic layer; forming a second magnetic layer over the tunnel barrier layer to have a pinned magnetization direction; and patterning the second magnetic layer, the tunnel barrier layer, the first magnetic layer, and the under layer to form a multilayer stack as a memory unit cell to store data.

In some implementations, the forming of the barrier layer includes using a first material having an FCC structure and a second material having a wurtzite structure to form the barrier layer. In some implementations, the forming of the barrier layer includes alloying the first material with the second material or co-sputtering the first material and the second material. In some implementations, the first material includes HfN, TiN, MoN, ZrN, or MgO. In some implementations, the second material includes AlN, AgI, ZnO, CdS, CdSe, a-SiC, GaN, or BN. In some implementations, the first metal layer has an HCP structure or a crystal structure of NaCl. In some implementations, the second metal layer comprises a metal nitride layer including a light metal.

DETAILED DESCRIPTION

Figure 1:
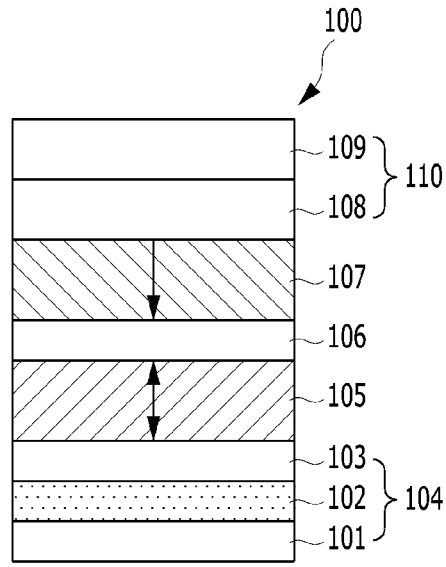
FIG. 1 is a cross-sectional view of an exemplary variable resistance element in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view of a variable resistance element in accordance with an implementation.

As illustrated in FIG. 1, the variable resistance element 100 may include an MTJ (Magnetic Tunnel Junction) structure which includes a first magnetic layer 105 having a variable magnetization direction which can change its magnetization direction in response to a bias such as an applied voltage or current, a second magnetic layer 107 having a pinned magnetization direction that is fixed in its direction, and a tunnel barrier layer 106 interposed between the first and second magnetic layers 105 and 107. Therefore, the variable resistance element 100 exhibits different resistance states showing different resistance values across the MTJ depending on the relative direction between the magnetization direction of the first magnetic layer 105 and the pinned magnetization direction of the second magnetic layer 107. The different resistance states are used for storing data.

The first and second magnetic layers 105 and 107 may include a ferromagnetic material. The ferromagnetic material may include an alloy based on Fe, Ni, or Co, for example, Fe—Pt alloy, Fe—Pd alloy, Co—Pd alloy, Co—Pt alloy, Fe—Ni—Pt alloy, or Co—Fe—Pt alloy.

The first and second magnetic layers 105 and 107 may have a magnetization direction perpendicular to the surfaces of the first and second magnetic layers 105 and 107. For example, as indicated by arrows of FIG. 1, the magnetization direction of the first magnetic layer 105 may be changed between the direction from top to bottom and the direction from bottom to top, and the magnetization direction of the second magnetic layer 107 may be pinned to the direction from top to bottom. Other implementations are also possible regarding the magnetization directions of the first and second magnetic layers 105 and 107.

The tunnel barrier layer 106 may include any insulating oxides, for example, MgO, CaO, SrO, TiO, VO, or NbO. The tunnel barrier layer 106 may change the magnetization direction of the first magnetic layer 105 through electron tunneling.

The variable resistance element 100 may further include layers 104 and 110 for improving the characteristic of the MTJ structure or facilitating a fabrication process. For example, the variable resistance element 100 may further include an under layer 104 arranged under the MTJ structure and an upper layer 110 arranged over the MTJ structure. The upper layer 110 may include a magnetism correction layer 108 and/or a capping layer 109 positioned at the uppermost part of the variable resistance element 100.

In the present implementation, the under layer 104 may include a first metal layer 101, a second metal layer 103, and a barrier layer 102 interposed between the first and second metal layers 101 and 103 and having a dual phase structure.

The first metal layer 101 may have an HCP (Hexagonal Closed Packed) structure or a crystal structure of sodium chloride (NaCl), thus improving the crystal orientations of the barrier layer 102 and the second metal layer 103 which are positioned over the first metal layer 101. The first metal layer 101 may include any metal layer having an HCP structure, for example, Hf, Zr, Mg, Ru, or Os. Alternatively, the first metal layer 101 may include any nitride having a crystal structure of NaCl, for example, zirconium nitride (ZrN), hafnium nitride (HfN), or titanium nitride (TiN).

The second metal layer 103 may include a light metal, and serve to reduce an attenuation constant of the first magnetic layer 105 positioned over the second metal layer 103. The light metal in the metal layer 103 may include Ti and/or a metal having a smaller specific gravity than Ti, for example, Al.

In the present implementation, the under layer 104 of the variable resistance element may include the barrier layer 102 having a dual phase structure which includes two different crystal phases or crystal structures. This dual phase structure further stabilizes the crystal orientation of the second metal layer 103 positioned over the barrier layer 102, within the under layer 104. As a result, the barrier layer 102 having such a dual phase structure may improve the thermal stability of the first magnetic layer 105 which interfaces with the under layer 104 and is on top of the under layer 104. This improved thermal stability of the first magnetic layer can stabilize the magnetic characteristic of the first magnetic layer 105.

As a specific example for the dual phase structure, the barrier layer 102 may include a material layer in which a first material having a first phase as an FCC (Face Centered Cubic) structure and a second material having a second phase as a wurtzite structure are mixed. As the barrier layer 102 is formed of or includes an alloy of the first and second materials or formed through co-sputtering, the barrier layer 102 may have a dual phase structure in which an FCC structure and a wurtzite structure are mixed. The first material may include any material including HfN, TiN, MoN, ZrN, or MgO, for example. The second material may include any material including AlN, AgI, ZnO, CdS, CdSe, a-SiC, GaN, or BN, for example.

The magnetism correction layer 108 in FIG. 1 is located above the pinned magnetic layer 107 of the variable resistance element and may serve to offset the influence of a stray field generated by the second magnetic layer 107 at the magnetic layer 105 having a variable magnetization direction. In implementations, the magnetism correction layer 108 may include an anti-ferromagnetic material or a ferromagnetic material having a magnetization direction antiparallel to the magnetization direction of the second magnetic layer 107. In this case, the influence of the stray field of the second magnetic layer 107 having a pinned magnetization on the first magnetic layer 105 having a variable magnetization may be offset to reduce a bias magnetic field in the first magnetic layer 105. In the present implementation, the magnetism correction layer 108 may be positioned over the MTJ structure. However, other implementations are also possible such that the position of the magnetism correction layer 108 may be modified in various manners.

The capping layer 109 may serve as a hard mask when the variable resistance element 100 is patterned, and include various conductive materials such as metal. In particular, the capping layer 109 may be formed of or include a metal-based material which includes a small number of pin holes and has great resistance to wet and/or dry etching.

Therefore, in the above structure in FIG. 1, the under layer 104 is designed to include the dual-phase barrier layer 102 to stabilize the crystal structure of the metal layer 103 on the top part of the under layer 104. This stabilized metal layer 103 interfaces with the variable magnetic layer 105 of the variable resistance element, thus providing a stabilization mechanism for the variable resistance element. In addition, in some implementations, FIG. 1 further illustrates a combination of two stabilization mechanisms to stabilize magnetic properties of the variable resistance element formed by the layers 107, 106 and 105. The second stabilization mechanism is the magnetism correction layer 108 located above the pinned magnetic layer 107 of the variable resistance element to reduce any undesired magnetic influence of the pinned magnetic layer 107 to the variable magnetic layer 105. This combination of the two stabilization mechanisms is integrated in the design in FIG. 1 so that the two mechanisms are used to collectively improve the performance of the variable resistance element in FIG. 1.

Figure 2:
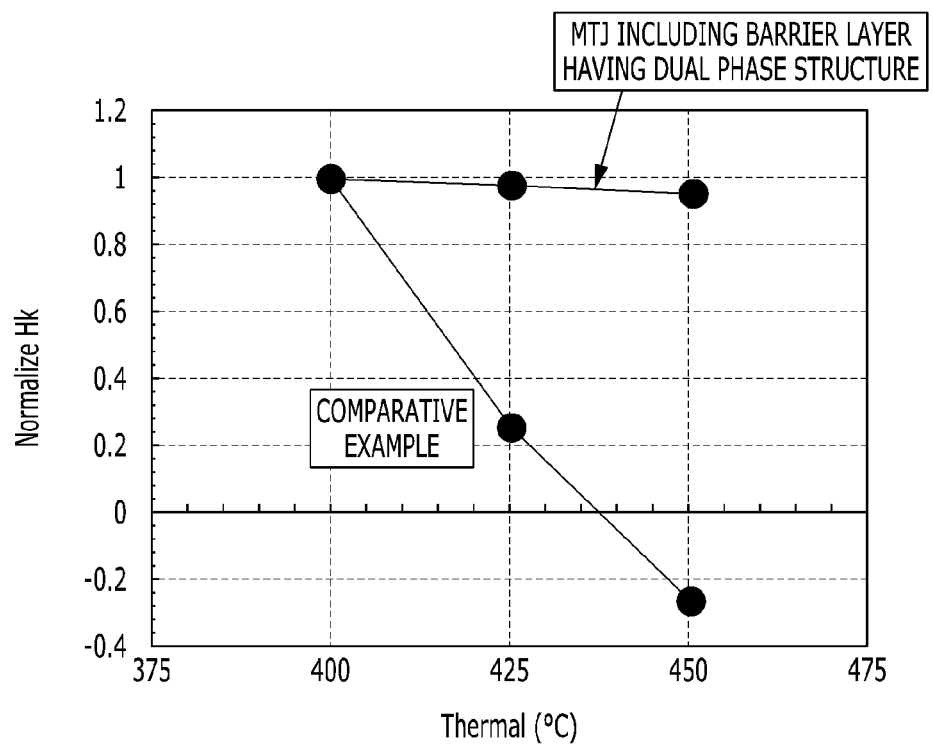
FIG. 2 is a graph illustrating the characteristics of a variable resistance element in accordance with a comparative example and the variable resistance element in accordance with one implementation of the disclosed technology.

FIG. 2 is a graph illustrating the characteristics of a variable resistance element in accordance with a comparative example and the variable resistance element in accordance with one implementation of the disclosed technology.

Referring to FIG. 2, the characteristics of the variable resistance elements of the comparative example and the present implementation may be compared to each other in accordance with a change of temperature. In FIG. 2, the horizontal axis may indicate the temperature, and the vertical axis may indicate a normalized Hk (perpendicular anisotropy field) value. The variable resistance element in accordance with the comparative example may indicate a general variable resistance element which does not include a barrier layer having a dual phase structure. The variable resistance element in accordance with the present implementation may include the barrier layer having a dual phase structure including, for example, a Hf—Al—N layer which is an alloy of HfN and AlN.

Referring to the graph in FIG. 2, the Hk value of the variable resistance element in accordance with the comparative example rapidly decreases as the temperature increases. In the variable resistance element in accordance with the present implementation, however, the Hk value does not change much and remains as almost constant. Base on FIG. 2, the thermal stability of the variable resistance element of the present implementation, which includes the barrier layer having a dual phase structure, has been improved as compared to the variable resistance element of the comparative example. Thus, the barrier layer having a dual phase structure may stabilize the magnetic characteristic of the variable resistance element.

Figure 3:
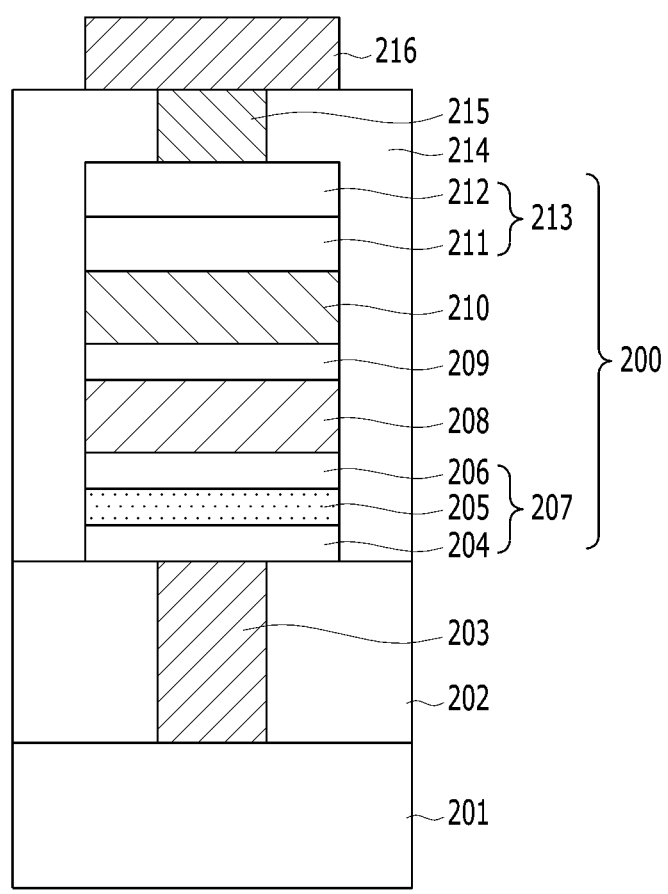
FIG. 3 is a cross-sectional view of an exemplary electronic device in accordance with an implementation.

FIG. 3 is a cross-sectional view of an exemplary electronic device in accordance with an implementation.

As illustrated in FIG. 3, the electronic device may include a substrate 201, a first interlayer dielectric layer 202, a bottom electrode contact 203, a variable resistance element 200, a second interlayer dielectric layer 214, a top electrode contact 215, and a conductive line 216. The substrate 201 may include a predetermined structure (not illustrated). The first interlayer dielectric layer 202 may be formed over the substrate 201. The bottom electrode contact 203 may be coupled to the substrate 201 through the first interlayer dielectric layer 202. The variable resistance element 200 may be formed over the bottom electrode contact 203. The second interlayer dielectric layer 214 may be buried between the variable resistance elements 200 or surround at least a portion of the variable resistance element 200. The top electrode contact 215 may be formed in contact with the top of the variable resistance element 200. The conductive line 216 may be formed over the second interlayer dielectric layer 214 so as to be in contact with the top electrode contact 215.

The predetermined structure included in the substrate 201 may include a switching element for selecting a specific unit cell from a plurality of unit cells included in a semiconductor device. The switching element may include a transistor, or a diode and the like. One terminal of the switching element may be electrically coupled to the bottom electrode contact 203, and the other terminal of the switching element may be electrically coupled to a source line (not illustrated) through a source line contact (not illustrated).

The first and second interlayer dielectric layers 202 and 214 may include an insulating material. The first and second interlayer dielectric layers 202 and 214 may include a single layer including oxide, nitride, or oxynitride or a stacked structure thereof.

The bottom electrode contact 203 may be positioned under the variable resistance element 200 and serve as a path for supplying a voltage or current to the variable resistance element 200. The bottom electrode contact 203 may include various conductive materials such as metal or metal nitride.

The variable resistance element 200 may include the same structure as the variable resistance element 100 illustrated in FIG. 1. For example, the variable resistance element 200 may include an MTJ structure including a first magnetic layer 208 having a variable magnetization direction, a second magnetic layer 210 having a pinned magnetization direction, and a tunnel barrier layer 209 interposed between the first and second magnetic layers 208 and 210. Furthermore, the variable resistance element 200 may further include layers 207 and 213 for improving the characteristic of the MTJ structure or facilitating the fabrication process.

The variable resistance element 200 may further include an under layer 207 arranged under the MTJ structure and an upper layer 213 arranged over the MTJ structure. The under layer 207 may include a first metal layer 204, a second metal layer 206, and a barrier layer 205 interposed between the first and second metal layers 204 and 206 and having a dual phase structure. The upper layer 213 may include a magnetism correction layer 211 and/or a capping layer 212 positioned at the uppermost part of the variable resistance element 200.

In the present implementation, the under layer 207 may be positioned over the first interlayer dielectric layer 202. However, other implementations are also possible. In another implementation, the under layer 207 and the bottom electrode contact 203 may be buried or formed together in the first interlayer dielectric layer 202.

The top electrode contact 215 may serve to electrically couple the conductive line 216 and the variable resistance element 200, and simultaneously serve as an electrode for the variable resistance element 200. The top electrode contact 215 may be formed of or include the same material as the bottom electrode contact 203.

The conductive line 216 may include a metal layer. The metal layer may indicate a conductive layer including a metal element, and include a metal, a metal oxide, a metal oxynitride, a metal silicide or the like.

FIGS. 4A to 4E are cross-sectional views illustrating an example of a method for fabricating an electronic device in accordance with an implementation.

Figure 4A:
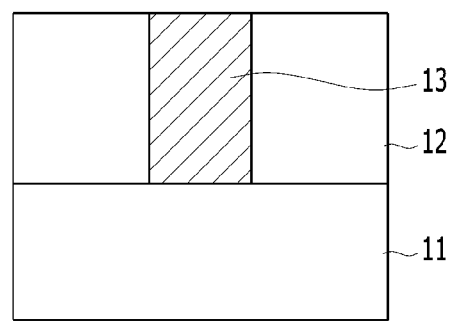
FIGS. 4A through 4E are cross-sectional views illustrating an example of a method for fabricating an electronic device in accordance with an implementation.

As illustrated in FIG. 4A, a first interlayer dielectric layer 12 may be formed over a substrate 11 including a predetermined structure. The predetermined structure may include a switching element and the like. The substrate 11 may include a semiconductor substrate or silicon substrate. The first interlayer dielectric layer 12 may include any single layer including oxide, nitride, or oxynitride or a stacked structure thereof.

Then, a bottom electrode contact 13 may be formed in contact with the substrate 11 through the first interlayer dielectric layer 12. The bottom electrode contact 13 may be formed through the following series of processes: a contact hole is formed to expose the substrate 11 through the first interlayer dielectric layer 12, a conductive material is formed on the surface (e.g., the entire surface of the resultant structure so as to fill the contact hole, and the adjacent bottom electrode contacts 13 are electrically isolated from one another. The isolation process may be performed by etching or polishing the conductive material formed on the surface (e.g., the entire surface using a blanket etch process (for example, etch-back process) or a chemical-mechanical polishing process, until the first interlayer dielectric layer 12 is exposed.

Figure 4B:
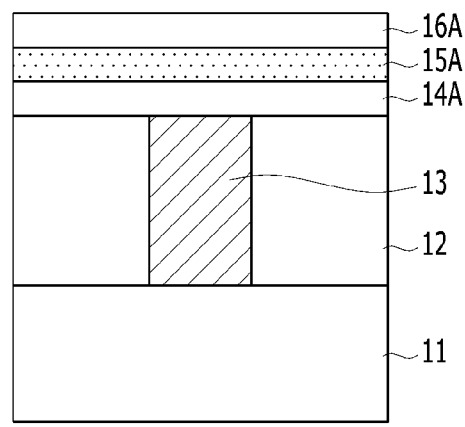

As illustrated in FIG. 4B, a first metal layer 14A, a barrier layer 15A having a dual phase structure, and a second metal layer 16A may be sequentially formed over the first interlayer dielectric layer 12 including the bottom electrode contact 13.

The first metal layer 14A may have an HCP structure or a crystal structure of NaCl, and thus improve the crystal orientations of the barrier layer 15A and the second metal layer 16A which are positioned over the first metal layer 14A. The first metal layer 14A may include any metal layer having an HCP structure, for example, Hf, Zr, Mg, Ru, or Os. Alternatively, the first metal layer 14A may include any nitride having a crystal structure of NaCl, for example, ZrN, HfN, or TiN.

The second metal layer 16A may include a light metal, and serve to reduce an attenuation constant of a first magnetic layer to be formed through a subsequent process. The light metal may include Ti and/or a metal having a smaller specific gravity than Ti, for example, Al.

The barrier layer 15A having a dual phase structure may include a material layer in which a first material having an FCC structure and a second material having a wurtzite structure are mixed, and further stabilize the crystal orientation of the second metal layer 16A positioned over the barrier layer 15A. As a result, the barrier layer 15A may increase the thermal stability of the first magnetic layer to be formed through a subsequent process, and stabilize the magnetic characteristic of the first magnetic layer.

In some implementations, the barrier layer 15A may be formed of or include an alloy of the first and second materials or formed through co-sputtering, and have a dual phase structure in which the FCC structure and the wurtzite structure are mixed. The first material may include any one material including HfN, TiN, MoN, ZrN, or MgO. The second material may include any material including AlN, AgI, ZnO, CdS, CdSe, a-SiC, GaN, or BN.

Figure 4C:
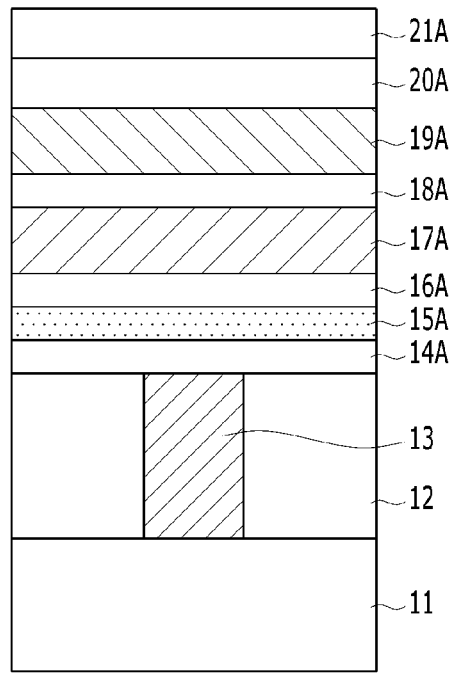

As illustrated in FIG. 4C, a first magnetic layer 17A, a tunnel barrier layer 18A, a second magnetic layer 19A, a magnetism correction layer 20A, and a capping layer 21A may be sequentially formed over the second metal layer 16A.

The first and second magnetic layers 17A and 19A may include a ferromagnetic material. The ferromagnetic material may include an alloy including Fe, Ni, or Co, for example, Fe—Pt alloy, Fe—Pd alloy, Co—Pd alloy, Co—Pt alloy, Fe—Ni—Pt alloy, Co—Fe—Pt alloy, or Co—Ni—Pt alloy. The first and second magnetic layers 17A and 19A may have a magnetization direction perpendicular to the surface of the first and second magnetic layers 17A and 19A.

The tunnel barrier layer 18A may include any insulating oxides, for example, MgO, CaO, SrO, TiO, VO, or NbO. The tunnel barrier layer 18A may change the magnetization direction of the first magnetic layer 17A through electron tunneling.

The magnetism correction layer 20A may serve to offset the influence of a stray field generated by the second magnetic layer 19A, and include an anti-ferromagnetic material or a ferromagnetic material having a magnetization direction anti-parallel to the magnetization direction of the second magnetic layer 19A. In this case, the influence of the stray field of the second magnetic layer 19A on the first magnetic layer 17A may be offset to reduce a bias magnetic field in the first magnetic layer 17A. In the present implementation, the magnetism correction layer 20A may be positioned over the MTJ structure. However, other implementations are also possible, and the position of the magnetism correction layer 20A may be modified in various manners.

The capping layer 21A may serve as a hard mask when the variable resistance element 200 is patterned, and include various conductive materials such as a metal. In particular, the capping layer 21A may be formed of or include a metal-based material which includes a small number of pin holes and has great resistance to wet and/or dry etching.

Figure 4D:
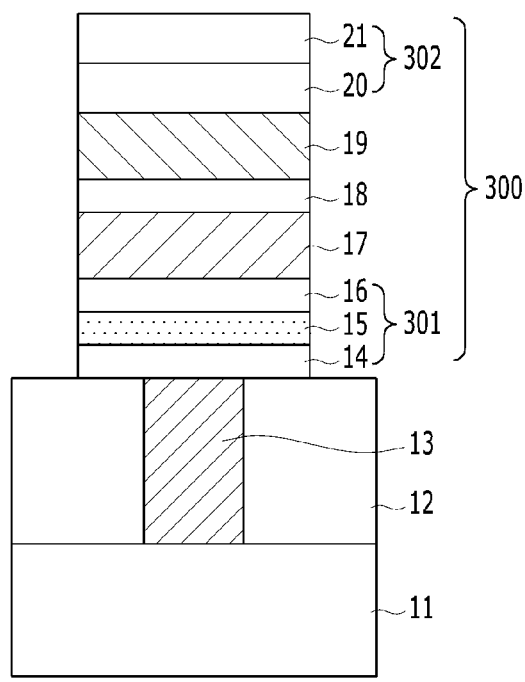

As illustrated in FIG. 4D, the sequentially deposited layers may be patterned to form a variable resistance element 300. The following series of processes may be performed to provide a desired structure: a mask pattern is formed over the capping layer 21A (refer to FIG. 4C), the capping layer 21A is etched, and the under layers are sequentially etched using the capping layer as an etching barrier.

The variable resistance element 300 formed through the patterning process may have the same structure as the variable resistance element 100 or 200 illustrated in FIG. 1 or 2.

Figure 4E:
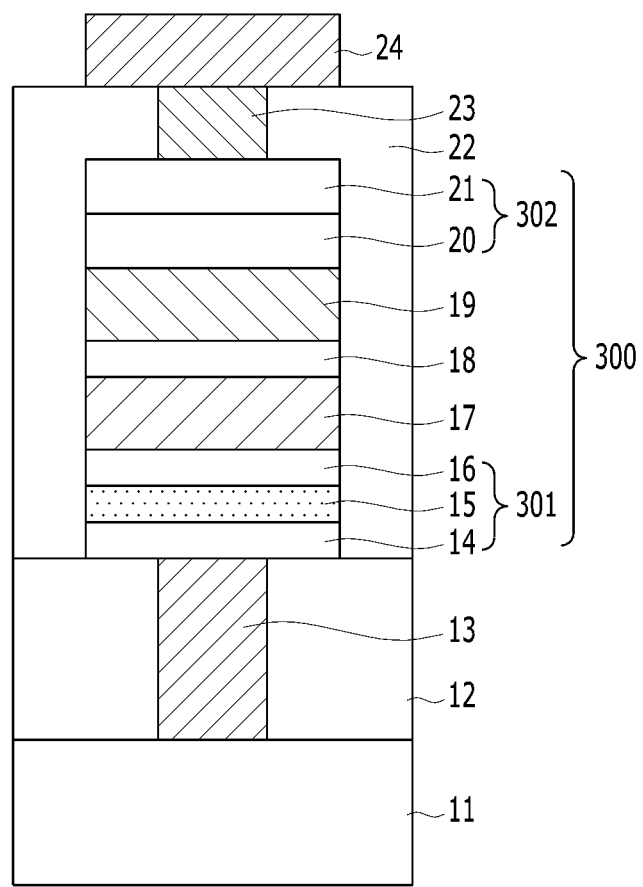

As illustrated in FIG. 4E, a second interlayer dielectric layer 22 may be formed over the first interlayer dielectric layer 12. The second interlayer dielectric layer 22 may be formed to a thickness to fill the space between the variable resistance elements 300 or surround at least a portion of the variable resistance element. For example, the second interlayer dielectric layer 22 may be formed to have a higher level than the top surface of the variable resistance element 300. The height of the second interlayer dielectric layer may be determined in consideration of the height of a top electrode contact, which will be formed in a following process, to surround the top electrode contact. The second interlayer dielectric layer 22 may include any single layer including oxide, nitride, or oxynitride or a stacked structure thereof.

Then, a top electrode contact 23 may be formed to be coupled to the variable resistance element 300 through the second interlayer dielectric layer 22 over the variable resistance element 300. The top electrode contact 23 may be formed by the following process: the second interlayer dielectric layer 22 is etched to form a contact hole exposing the top of the variable resistance element 300, and a conductive material is buried in the contact hole. The top electrode contact 23 may serve to electrically couple the variable resistance element 300 and a conductive line 24 to be formed through a subsequence process, and simultaneously serve as an electrode for the variable resistance element 300. The top electrode contact 23 may be formed of or include the same material as the bottom electrode contact 13.

Then, the conductive line 24 may be formed over the second interlayer dielectric layer 22. The conductive line 24 may be electrically coupled to the variable resistance element 300 through the top electrode contact 23. The conductive line 24 coupled to the variable resistance element 300 may serve as a bit line. The conductive line 24 may include a metal layer. The metal layer may indicate a conductive layer including a metal element, and include a metal, a metal oxide, a metal oxynitride, or a metal silicide and the like.

In accordance with various implementations of the disclosed technology, the electronic device and the method for fabricating the same can improve the characteristic of the variable resistance element.

The above and other memory circuits or semiconductor devices based on the disclosed technology can be used in a range of devices or systems. FIGS. 5-9 provide some examples of devices or systems that can implement the memory circuits disclosed herein.

Figure 5:
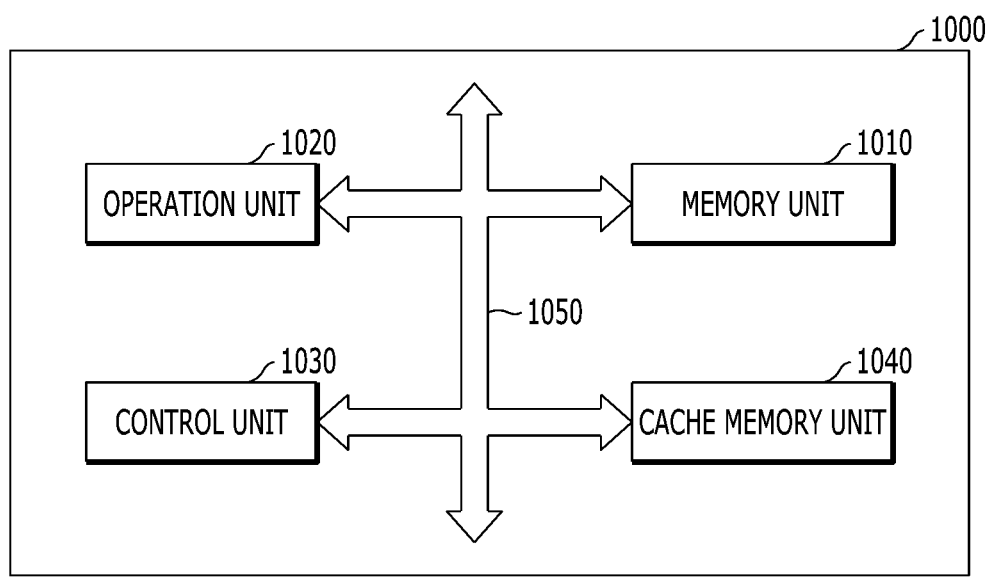
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
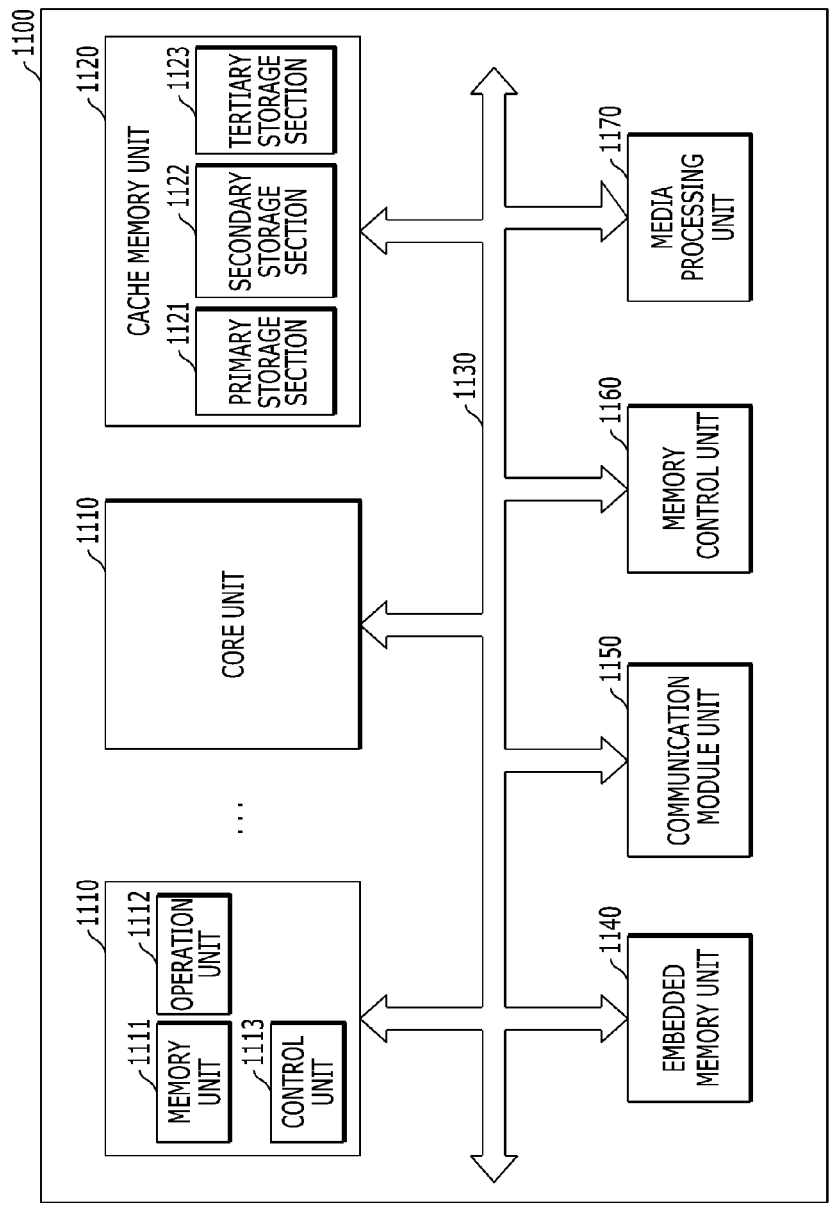
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
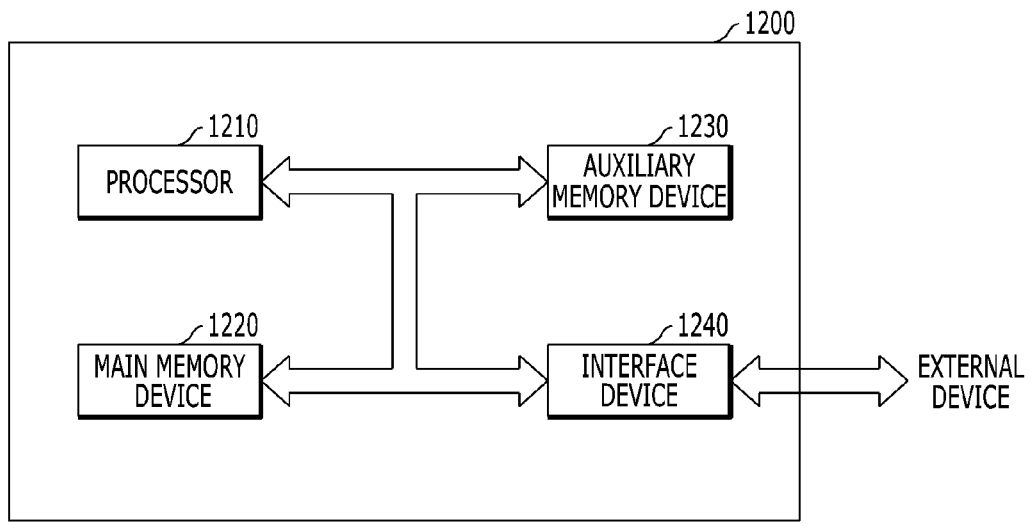
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
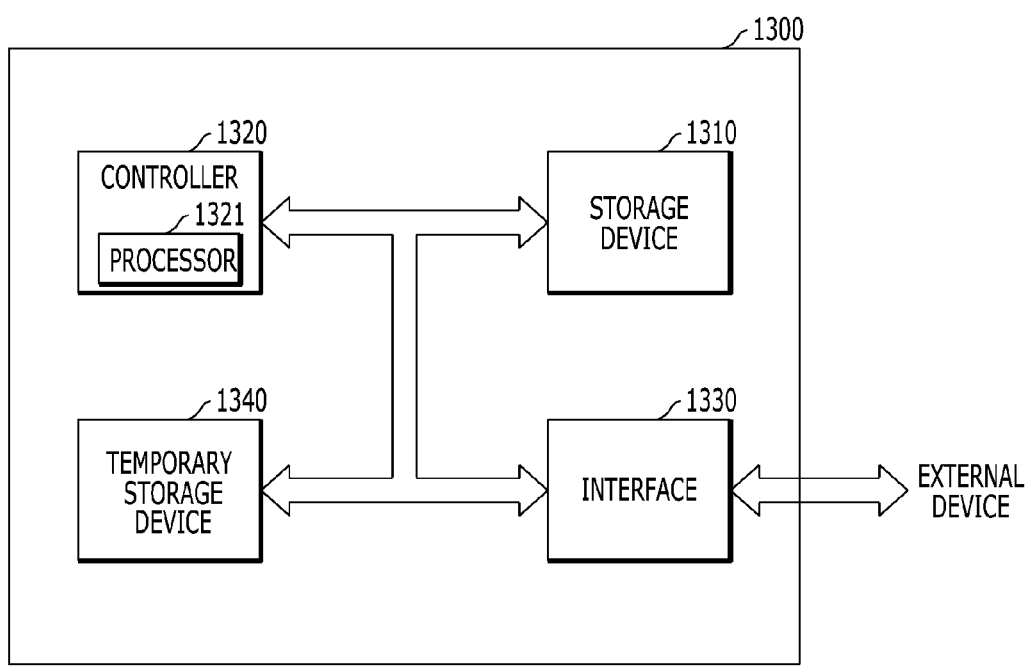
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 9:
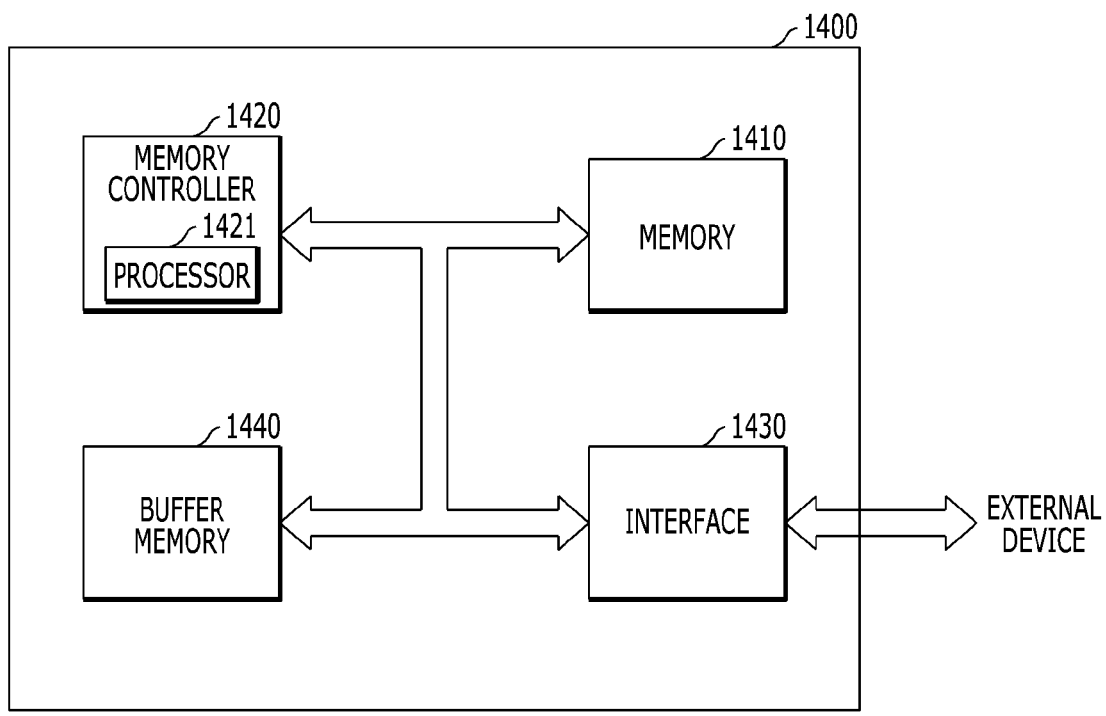
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
    wherein the semiconductor memory comprises:
    an under layer comprising first and second metal layers and a barrier layer having a dual phase structure of different crystal structures and interposed between the first and second metal layers;
    a first magnetic layer positioned over the under layer and having a variable magnetization direction;
    a tunnel barrier layer positioned over the first magnetic layer; and
    a second magnetic layer positioned over the tunnel barrier layer and having a pinned magnetization direction.

2. The electronic device of claim 1, wherein the barrier layer includes a first material having an FCC (Face Centered Cubic) structure and a second material having a wurtzite structure.

3. The electronic device of claim 2, wherein the barrier layer includes an alloy of the first and second materials.

4. The electronic device of claim 2, wherein the first material comprises HfN, TiN, MoN, ZrN, or MgO.

5. The electronic device of claim 2, wherein the second material comprises AlN, AgI, ZnO, CdS, CdSe, a-SiC, GaN, or BN.

6. The electronic device of claim 1, wherein the first metal layer has an HCP (Hexagonal Closed Packed) structure or a crystal structure of NaCl.

7. The electronic device of claim 1, wherein the second metal layer comprises a metal nitride layer including a light metal.

8. The electronic device of claim 1, wherein the first metal layer is positioned under the second metal layer.

9. The electronic device of claim 1, wherein the first metal layer includes Hf, Zr, Mg, Ru, or Os.

10. The electronic device of claim 1, wherein the first metal layer includes ZrN, HfN, or TiN.

11. The electronic device of claim 1, wherein the second metal layer comprises Al or Ti.

12. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit that includes the resistance variable element is part of the memory unit in the microprocessor.

13. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that includes the resistance variable element is part of the cache memory unit in the processor.

14. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

15. The electronic device according to claim 1, further comprising a data storage system which includes:
   - a storage device configured to store data and conserve stored data regardless of power supply;
   - a controller configured to control input and output of data to and from the storage device according to a command inputted form an outside;
   - a temporary storage device configured to temporarily store data exchanged between the storage device and the outside; and
   - an interface configured to perform communication between at least one of the storage device, the controller and the temporary storage device and the outside,
   - wherein the semiconductor memory unit that includes the resistance variable element is part of the storage device or the temporary storage device in the data storage system.

16. The electronic device according to claim 1, further comprising a memory system which includes:
   - a memory configured to store data and conserve stored data regardless of power supply;
   - a memory controller configured to control input and output of data to and from the memory according to a command inputted form an outside;
   - a buffer memory configured to buffer data exchanged between the memory and the outside; and
   - an interface configured to perform communication between at least one of the memory, the memory controller and the buffer memory and the outside,
   - wherein the semiconductor memory unit that includes the resistance variable element is part of the memory or the buffer memory in the memory system.

17. The electronic device according to claim 1, wherein the semiconductor memory further comprises a magnetism correction layer formed over the second magnetic layer and configured to produce a magnetic field at the first magnetic layer to reduce an influence of a magnetic field of the second magnetic layer at the first magnetic layer.

* * * * *